(12) United States Patent
Zhang et al.

(10) Patent No.: US 12,232,373 B2
(45) Date of Patent: Feb. 18, 2025

(54) DISPLAY SUBSTRATE WITH TRANSITION AREA AND MANUFACTURING METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Taoran Zhang, Beijing (CN); Da Zhou, Beijing (CN); Wenjun Liao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 919 days.

(21) Appl. No.: 17/299,317

(22) PCT Filed: Oct. 29, 2020

(86) PCT No.: PCT/CN2020/124931
§ 371 (c)(1),
(2) Date: Jun. 3, 2021

(87) PCT Pub. No.: WO2021/098475
PCT Pub. Date: May 27, 2021

(65) Prior Publication Data
US 2022/0059639 A1 Feb. 24, 2022

(30) Foreign Application Priority Data
Nov. 19, 2019 (CN) .......................... 201911133333.0

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .......................... H10K 59/131; H10K 59/1201
(Continued)

(56) References Cited

U.S. PATENT DOCUMENTS 10,032,847 B2  7/2018  Jeon
2018/0108723 A1  4/2018  Nishimura
(Continued)

FOREIGN PATENT DOCUMENTS

CN  108305880 A  7/2018
CN  109545796 A  3/2019
(Continued)

OTHER PUBLICATIONS

International Search Report for PCT/CN2020/124931 Mailed Feb. 5, 2021.
(Continued)

*Primary Examiner* — Xia L Cross
(74) *Attorney, Agent, or Firm* — Ling Wu; Stephen Yang; Ling and Yang Intellectual Property

(57) ABSTRACT

A display substrate, including: a display region, a pad bending region, and a first transition region located between the display region and the pad bending region, wherein the display region is provided with a signal line layer; the pad bending region is provided with a first wire layer; the first transition region is provided with a first connecting layer; the first connecting layer is provided with a first step formed by at least one inorganic insulation layer; the signal line layer is electrically connected to the first connecting layer by means of a first through hole provided in the first step; and the first wire layer is electrically connected to the first connecting layer.

13 Claims, 8 Drawing Sheets

(58) Field of Classification Search
USPC ............................................................ 257/40
See application file for complete search history.

(56) References Cited

U.S. PATENT DOCUMENTS

| | | | |
|---|---|---|---|
| 2019/0341402 A1 | 11/2019 | Li | |
| 2020/0013844 A1* | 1/2020 | Cho | .................... H10K 59/805 |
| 2020/0176484 A1 | 6/2020 | Yin | |
| 2021/0043701 A1 | 2/2021 | Li et al. | |

FOREIGN PATENT DOCUMENTS

| | | |
|---|---|---|
| CN | 109786430 A | 5/2019 |
| CN | 109859624 A | 6/2019 |
| CN | 110718563 A | 1/2020 |

OTHER PUBLICATIONS

Office Action dated Mar. 5, 2021 for Chinese Patent Application No. 201911133333.0 and English Translation.

* cited by examiner

ND manufacturing METHOD
DISPLAY SUBSTRATE WITH TRANSITION AREA AND MANUFACTURING METHOD THEREOF, AND DISPLAY APPARATUS The present application claims the priority of Chinese Patent Application No. 201911133333.0, filed to the CNIPA on Nov. 19, 2019 and entitled "Display Substrate and Manufacturing Method Thereof, and Display Apparatus," the content of which should be construed as being incorporated into the present application by reference.

TECHNICAL FIELD

The present disclosure relates to, but is not limited to, the field of display technology, and particularly relates to a display substrate and a manufacturing method thereof, and a display apparatus.

BACKGROUND

At present, users and the market have gradually higher requirements for a screen-to-body ratio of a display product such as smart phone, and a full-screen display product without a bezel or with a narrow bezel has become a mainstream development direction. In order to reduce a width of a screen bezel, a part of the bezel is usually bent to the back of the screen, for example, a bezel area for being disposed a driving chip and a bonding circuit is bent to the back of the screen, and a bending area (that is, Pad Bending area) may be disposed between the bezel area for being disposed the driving chip and the bonding circuit and other bezel areas that are not bent.

SUMMARY

The following is a summary of subject matter described in detail herein. This summary is not intended to limit the protection scope of the claims.

Embodiments of the present disclosure provide a display substrate and a manufacturing method thereof, and a display apparatus.

In an aspect, an embodiment of the present disclosure provides a display substrate, including a display area, a bending area, and a first transition area between the display area and the bending area. The display area is disposed with a signal line layer, the bending area is disposed with a first lead layer, the first transition area is disposed with a first connection layer, and the first connection layer is disposed with a first step formed of at least one inorganic insulating layer. The signal line layer is electrically connected with the first connection layer through a first via hole opened in the first step, and the first lead layer is electrically connected with the first connection layer.

In another aspect, an embodiment of the present disclosure provides a display apparatus including the display substrate as described above.

In another aspect, an embodiment of the present disclosure provides a manufacturing method of a display substrate. The display substrate includes a display area, a bending area, and a first transition area between the display area and the bending area. The manufacturing method comprising: forming a first connection layer in the first transition area, and forming a first step on the first connection layer, the first step being formed of at least one inorganic insulating layer; forming a signal line layer in the display area, and forming a first lead layer in the bending area. The signal line layer is electrically connected with the first connection layer through a first via hole opened in the first step, and the first lead layer is electrically connected with the first connection layer.

Other aspects will be understood after the drawings and the detailed description are read and understood.

BRIEF DESCRIPTION OF DRAWINGS

Accompanying drawings are used to provide an understanding of technical solutions of the present disclosure and form a part of the specification. Together with embodiments of the present disclosure, they are used to explain the technical solutions of the present disclosure and do not constitute a limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
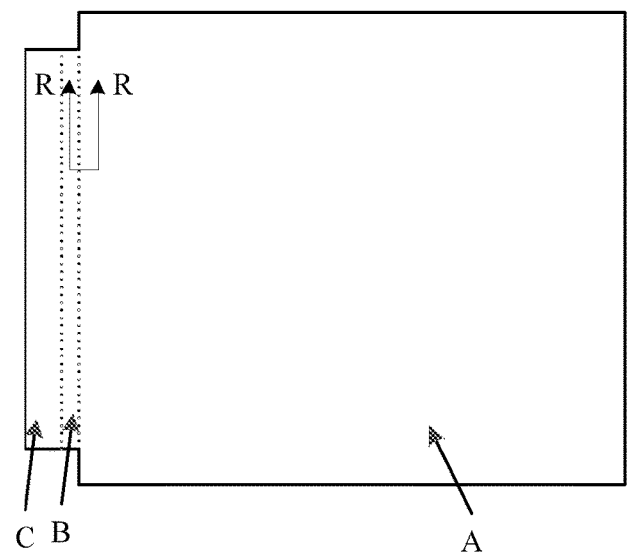
FIG. 1 is a schematic diagram of a structure of a display substrate.

A plurality of embodiments are described in the present disclosure, but the description is exemplary rather than restrictive, and it is apparent to those of ordinary skills in the art that there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any conventional features or elements to form a unique scheme defined by the claims. Any feature or element of any embodiment may also be combined with features or elements from other inventive solutions to form another unique inventive solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, various modifications and changes may be made within the protection scope of the appended claims.

Furthermore, when describing representative embodiments, the specification may have presented a method or process as a specific order of acts. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. Furthermore, the claims for the method or process should not be limited to performing the acts in the order written in the disclosure, and those skilled in the art can easily understand that these orders may be varied but still remain within the essence and scope of the embodiments of the present disclosure.

In a traditional implementation, a thickness of an inorganic film layer in a bending area is reduced by trenching the inorganic film layer in the bending area, so as to achieve 180-degree bending. However, when the inorganic film layer is trenched in the bending area, steps will be formed in the inorganic film layer, which results in a large drop in signal traces at the steps, leads to conductive material remain in a Dry Etch process for the signal traces to cause short circuit, and in turn causes a display panel to have dark lines or bright lines (X-lines), and affects a product yield.

Figure 2:
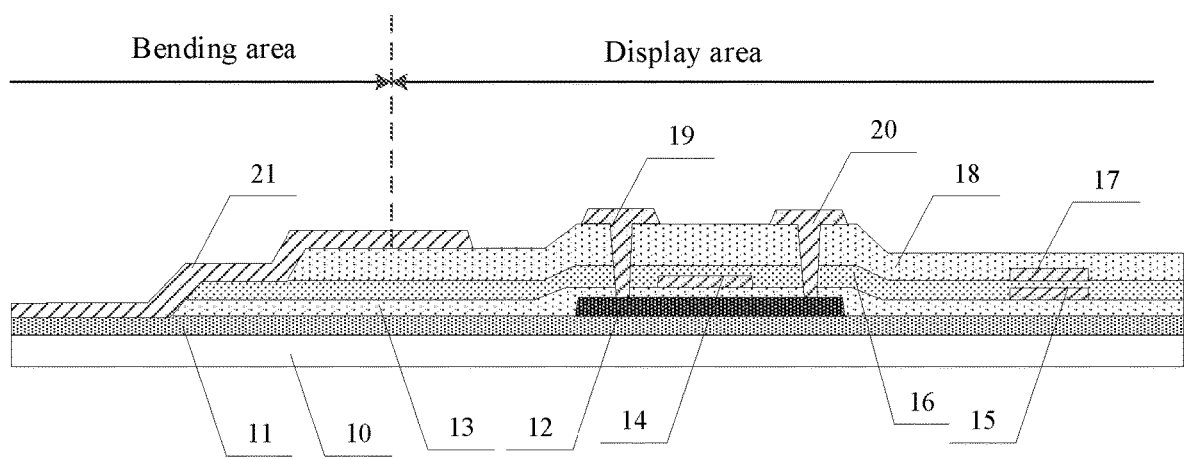
FIG. 2 is a partial sectional view taken along a R-R direction in FIG. 1.

FIG. 1 is a schematic diagram of a structure of a display substrate. FIG. 2 is a partial sectional view taken along a R-R direction in FIG. 1. As shown in FIG. 1, the display substrate includes a display area A, a bending area B and a peripheral area C. The display area A may be disposed with a sub-pixel array and signal lines, the peripheral area C may be disposed with a driving chip, and the driving chip may provide a driving signal to the display area A. The bending area B is located between the display area A and the peripheral area C, and the bending area B is disposed with signal leads, which are configured to electrically connect the driving chip in the peripheral area C with the signal lines in the display area A. The peripheral area C may be folded by the bending area B, for example, folded to a back of the display area A.

As shown in FIG. 2, the sub-pixel array in the display area includes a thin film transistor and a storage capacitor. The thin film transistor includes a barrier layer 11, an active layer 12, a first insulating layer 13, a first gate electrode 14, a second insulating layer 16, a third insulating layer 18, and a source/drain electrode layer (including a source electrode 19 and a drain electrode 20) which are sequentially disposed on a substrate 10. The storage capacitor includes a second gate electrode 15, a capacitor insulating layer (that is, a second insulating layer 16) and a capacitor electrode 17 which are sequentially disposed on the substrate 10. Among them, after the third insulating layer 18 is formed, the third insulating layer 18, the second insulating layer 16, and the first insulating layer 13 in the bending area may be sequentially removed by two mask processes (for example, Edge Bending A (EBA) mask and Edge Bending B (EBB) mask), thereby reducing the thickness of the inorganic film layer in the bending area to achieve bending. Among them, signal leads 21 in the bending area and the source/drain electrode layer in the display area are disposed on the same layer, and are manufactured by the same process.

It can be seen from FIG. 2 that steps will be formed by trenching the inorganic film layer in the bending area, which results in a large drop in the traces of the signal leads 21. A problem of the conductive material remain is easy to occur in the Dry Etch process for manufacturing the signal leads, which in turn leads to short circuit, results in defective X-Lines, and affects the product yield. And large amount of the conductive material remain also has great reliability risk.

Embodiments of the present disclosure provide a display substrate, a manufacturing method thereof, and a display apparatus, which may alleviate a problem of conductive material remain at steps of an inorganic film layer in a bending area.

An embodiment of the present disclosure provides a display substrate, which includes a display area, a bending area and a first transition area between the display area and the bending area. The display area is disposed with a signal line layer, the bending area is disposed with a first lead layer, the first transition area is disposed with a first connection layer, and the first connection layer is disposed with a first step formed of at least one inorganic insulating layer. The signal line layer is electrically connected with the first connection layer through a first via hole opened in the first step, and the first lead layer is electrically connected with the first connection layer. The inorganic insulating layer forming the first step may include an interlayer insulating (also referred to as Inner Layer Dielectric (ILD)) layer, or the interlayer insulating layer and a gate insulating (also referred to as Gate Insulator (GI)) layer.

In some exemplary embodiments, an inorganic insulating layer is disposed between the first lead layer and the first connection layer, and the first lead layer is electrically connected with the first connection layer through a second via hole penetrating through the inorganic insulating layer. The inorganic insulating layer disposed between the first lead layer and the first connection layer may be a gate insulating layer. However, the present embodiment is not limited to this.

In some exemplary implementations, a material of the first connection layer may be metal (e.g., molybdenum Mo) or a material with semiconductor property (e.g., polysilicon).

In some exemplary embodiments, the display substrate may further include a second transition area and a peripheral area, and the second transition area is located between the bending area and the peripheral area. The peripheral area is disposed with a second lead layer, the second transition area is disposed with a second connection layer, and the second connection layer is disposed with a second step formed of at least one inorganic insulating layer. The second lead layer is electrically connected with the second connection layer through a third via hole opened in the second step, and the first lead layer is electrically connected with the second connection layer. The inorganic insulating layer forming the second step may include an interlayer insulating layer, or the interlayer insulating layer and a gate insulating layer. However, the present embodiment is not limited to this.

In some exemplary implementations, an inorganic insulating layer is disposed between the first lead layer and the second connection layer, and the first lead layer is electrically connected with the second connection layer through a fourth via hole penetrating through the inorganic insulating layer. The inorganic insulating layer disposed between the first lead layer and the second connection layer may be a gate Insulating layer. However, the present embodiment is not limited to this.

In some exemplary implementations, the second connection layer and the first connection layer are disposed on the same layer and made of the same material.

According to the embodiment of the present disclosure, an electrical connection between the signal line layer in the display area and the first lead layer in the bending area is achieved by disposing the first connection layer, and disposing of the traces on the first step are avoided, thereby alleviating the problem of the conductive material remain at the step in the etching process, achieving normal signal transmission, improving product yield and ensuring display effect.

The technical solutions of the embodiments of the present disclosure are described in detail below through some examples.

Figure 3:
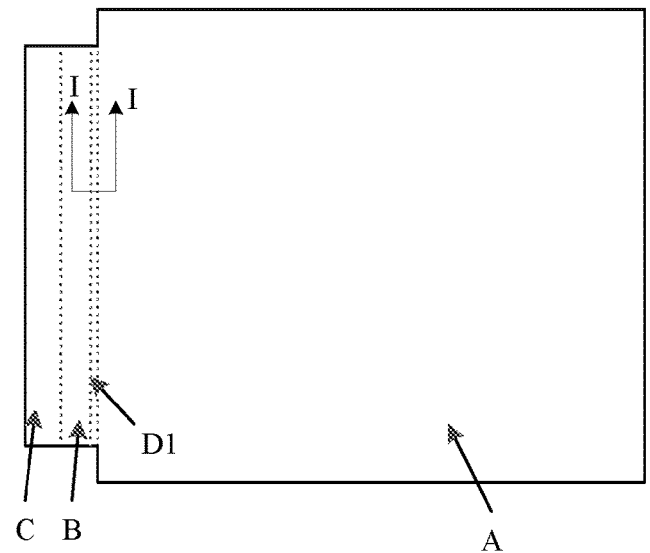
FIG. 3 is a schematic diagram of a structure of a display substrate according to at least one embodiment of the present disclosure.
Figure 4:
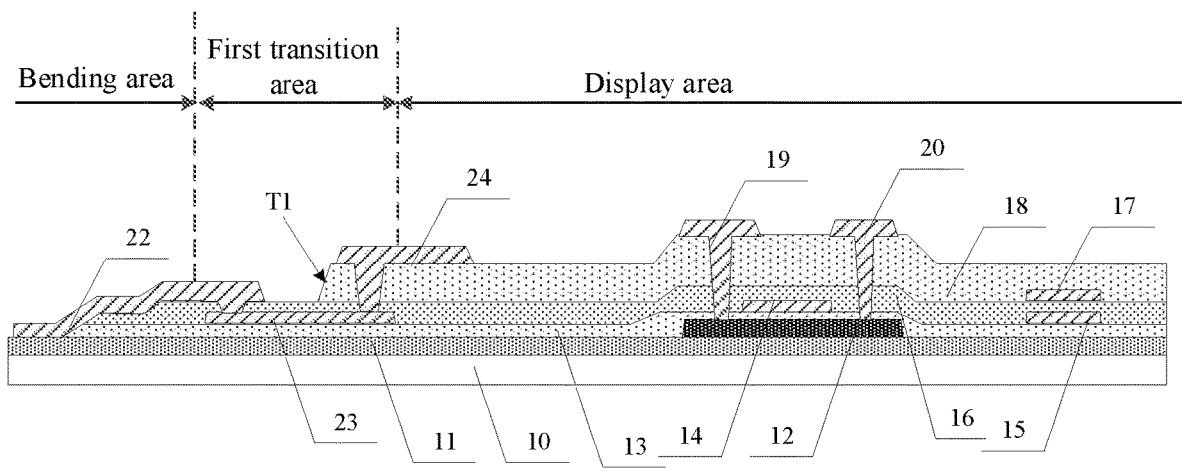
FIG. 4 is a partial sectional view taken along an I-I direction in FIG. 3.

FIG. 3 is a schematic diagram of a structure of a display substrate according to at least one embodiment of the present disclosure. FIG. 4 is a sectional view taken along an I-I direction in FIG. 3. As shown in FIG. 3, on a direction parallel to the display substrate, a body structure of the display substrate includes: a display area A, a first transition area D1, a bending area B and a peripheral area C. The first transition area D1 is located between the display area A and the bending area B, and the peripheral area C is located on a side of the bending area B away from the first transition area D1. Among them, the peripheral area C may be disposed with a driving chip, and the driving chip may provide a driving signal to the display area A. However, the present embodiment is not limited to this. In other implementations, the bending area may also be located at opposite upper and lower sides of the display area, or at four sides of the display area.

FIG. 4 illustrates a structure of a display area, a first transition area and a bending area on a direction perpendicular to a display substrate. As shown in FIG. 4, on the direction perpendicular to the display substrate, a body structure of the display area includes a plurality of light emitting units and signal lines distributed in an array. At least one of the plurality of light emitting units includes a driving structure layer and a light emitting structure layer disposed on a substrate, and the driving structure layer includes a plurality of Thin Film Transistors (TFTs). The signal lines may include data lines and gate lines (not shown). In FIG. 4, only one thin film transistor included in one light emitting unit is taken as an example. The driving structure layer includes a barrier layer 11 disposed on a substrate 10 and a thin film transistor and a storage capacitor disposed on the barrier layer 11. The thin film transistor includes an active layer 12, a first insulating layer 13, a first gate electrode 14, a second insulating layer 16, a third insulating layer 18, and source/drain electrode layer (for example, including a source electrode 19 and a drain electrode 20) sequentially disposed on the barrier layer 11. The storage capacitor includes a second gate electrode 15, a capacitor insulating layer (that is, a second insulating layer 16) and a capacitor electrode 17 sequentially disposed on the substrate 10.

As shown in FIG. 4, on a direction perpendicular to the display substrate, a body structure of the bending area includes: the barrier layer 11 disposed on the substrate 10, and a first lead layer 22 disposed on the barrier layer 11. A body structure of the first transition area includes: the barrier layer 11 disposed on the substrate 10, the first insulating layer 13 disposed on the barrier layer 11, a first connection layer 23 disposed on the first insulating layer 13, the second insulating layer 16 disposed on the first connection layer 13, and a first step T1 disposed on the second insulating layer 16. The first step T1 is formed of the third insulating layer 18.

As shown in FIG. 4, a signal line layer 24 in the display area is electrically connected with the first connection layer 23 through a first via hole opened in the first step T1. The first lead layer 22 in the bending area is electrically connected with the first connection layer 23 through a second via hole penetrating through the second insulating layer 16. An electrical connection between the signal line layer 24 in the display area and the first lead layer 22 in the bending area may be achieved by the first connection layer 23, thereby avoiding forming of traces on the first step T1 and alleviating the problem of conductive material remain at the first step T1 in the etching process. Furthermore, the second insulating layer 16 is retained on the first connection layer 23, which can reduce the short circuit caused by an upper conductive material and the first connection layer 23.

The technical solutions of the present embodiment are further described below through a process for manufacturing the display substrate in the present embodiment. A "patterning process" mentioned in the present embodiment includes processes such as deposition of a film layer, coating of photoresist, mask exposure, development, etching, stripping of photoresist, etc., and is a known mature manufacturing process. Deposition may be performed by using a known process such as sputtering, evaporation, chemical vapor deposition, or the like, coating may be performed by using a known coating process, and etching may be performed by using a known method, which is not limited here.

FIG. 5 to FIG. 9 are schematic diagrams of a manufacturing process of a display substrate according to at least one embodiment of the present disclosure. In some exemplary embodiments, the manufacturing process of the display substrate includes the following acts.

Figure 5:
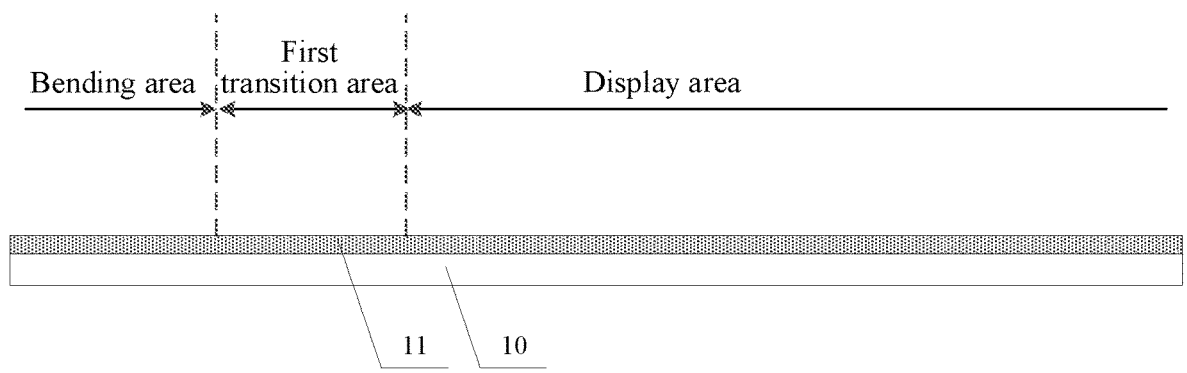
FIG. 5 is a schematic diagram of a display substrate after forming a barrier layer according to at least one embodiment of the present disclosure.

(1) A barrier layer is formed on a substrate. Forming the barrier layer on the substrate includes: depositing a barrier film on the substrate 10 to form a barrier layer 11, as shown in FIG. 5.

Among them, the substrate 10 may be a flexible substrate made of a material such as polyimide (PI), polyethylene terephthalate (PET), or a surface-treated polymer soft film. The barrier film may be made of silicon nitride (SiNx), silicon oxide (SiOx) or the like, it may be a single layer or may be a multi-layer structure of the silicon nitride/silicon oxide. In present embodiment, the barrier layer 11 is used for improving a capability of water oxygen resistance of the substrate 10.

Figure 6:
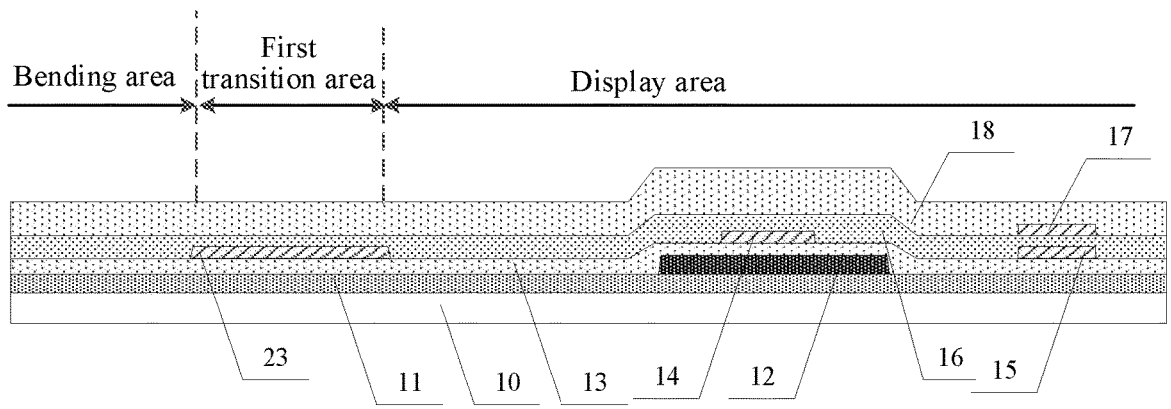
FIG. 6 is a schematic diagram of a display substrate after forming a pattern of a third insulating layer according to at least one embodiment of the present disclosure.

(2) A pattern of an active layer is formed on the substrate. Forming the pattern of the active layer on the substrate includes: depositing an active layer film on the substrate 10 formed with the above structure, and patterning the active layer film through a patterning process to form the pattern of the active layer 12 disposed on the barrier layer 11, as shown in FIG. 6. Among them, the pattern of the active layer 12 is only formed in the display area, and only the barrier layer 11 is formed in the bending area and the first transition area at this time.

Among them, the active layer film may be made of at least one material such as amorphous indium gallium zinc Oxide (a-IGZO), zinc oxynitride (ZnON), indium zinc tin oxide (IZTO), amorphous silicon (a-Si), polysilicon (p-Si), sexithiophene or polythiophene, that is, the present embodiment is simultaneously applicable to a Top Gate Thin Film Transistor (TFT)-based display substrate manufactured based on an Oxide technology, a silicon technology and an organic technology.

(3) Patterns of a gate electrode layer and a first connection layer are formed. Forming the patterns of the gate electrode layer and the first connection layer includes: sequentially depositing a first insulating film and a first metal film on the substrate 10 formed with the above structure, and patterning the first metal film through a patterning process to form patterns of a first insulating layer 13 covering the active layer 12 and the barrier layer 11, a first connection layer 23 disposed on the first insulating layer 13, a first gate electrode 14, a second gate electrode 15 and gate lines (not shown), as shown in FIG. 6. Among them, the first connection layer 23 is formed in the first transition area; the first gate electrode 14, the second gate electrode 15 and the gate lines (not shown) are formed in the display area.

Among them, the first insulating film may be made of silicon oxide (SiOx), silicon nitride (SiNx), silicon oxynitride (SiON), etc., or a material of high dielectric constant (High k) such as aluminum oxide (AlOx), hafnium oxide (HfOx), tantalum oxide (TaOx), etc., and may be a single layer, multiple layers, or a composite layer.

Among them, the first metal film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed of a metal and a transparent conductive material, such as indium tin oxide (ITO)/argentum (Ag)/indium tin oxide (ITO).

(4) A pattern of a capacitor electrode layer is formed. Forming the pattern of the capacitor electrode layer includes: sequentially depositing a second insulating film and a second metal film on the substrate 10 formed with the above structure, and patterning the second metal film through a patterning process to form patterns of a second insulating layer 16 covering the first connection layer 23, the first gate electrode 14, the second gate electrode 15 and the first insulating layer 13, and a capacitor electrode 17 disposed on the second insulating layer 16, as shown in FIG. 6. Among them, a position of the capacitor electrode 17 corresponds to a position of the second gate electrode 15, and the capacitor electrode 17 and the second gate electrode 15 form a capacitor.

Among them, the second insulating film may be made of silicon oxide (SiOx), silicon nitride (SiNx), silicon oxynitride (SiON), etc., or a material of high dielectric constant (High k) such as aluminum oxide (AlOx), hafnium oxide (HfOx), tantalum oxide (TaOx), etc., and may be a single layer, multiple layers, or a composite layer.

Among them, the second metal thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

(5) A pattern of a third insulating layer is formed. Forming the pattern of the third insulating layer includes: depositing a third insulating film on the substrate 10 formed with the above structure, and patterning the third insulating film through a patterning process to form a third insulating layer 18, as shown in FIG. 6.

Among them, the first insulating film may be made of silicon oxide (SiOx), silicon nitride (SiNx), silicon oxynitride (SiON), etc., or a material of high dielectric constant (High k) such as aluminum oxide (AlOx), hafnium oxide (HfOx), tantalum oxide (TaOx), etc., and may be a single layer, multiple layers, or a composite layer.

The first insulating layer 13 and the second insulating layer 16 are also referred to as a gate insulating layer, and the third insulating layer 18 is also referred to as an interlayer insulating layer.

Figure 7:
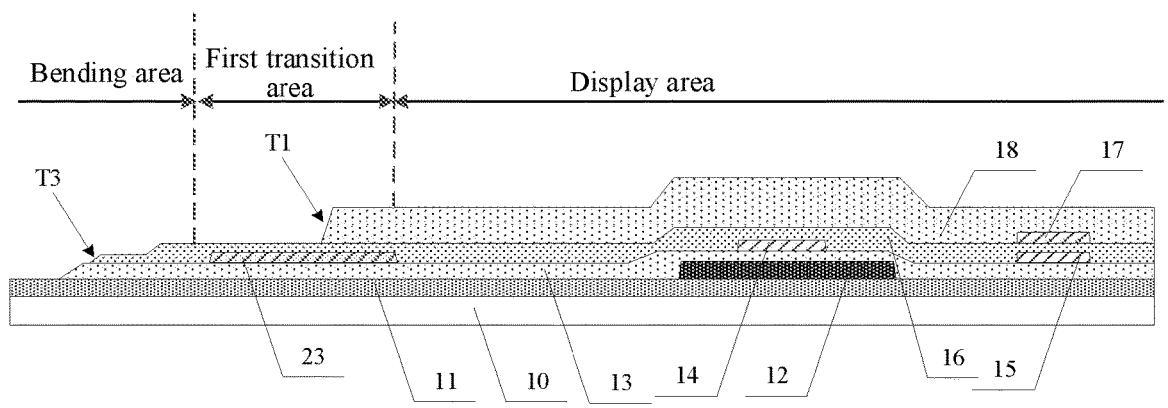
FIG. 7 is a schematic diagram of a display substrate after forming a first step and a third step according to at least one embodiment of the present disclosure.

(6) A first step and a third step are formed. Forming the first step and the third step includes: etching the third insulating layer 18 on the substrate 10 formed with the above structure by using a first mask (e.g., EBA mask) through related processes such as laser, forming a first step T1 on the first connection layer 23 in the first transition area, etching the first insulating layer 13 and the second insulating layer 16 by using a second mask (e.g., EBB mask) and related processes such as laser, and forming a third step T3 in the bending area, as shown in FIG. 7.

In present embodiment, in the process of forming the first step T1 by etching the inorganic film layer, the third insulating layer 18 may be etched by controlling the etching rate of the inorganic film layer, and the second insulating layer 16 may be retained, so as to ensure that a surface of the first connection layer 23 is covered with a part of the second insulating layer 16, and prevent the first connection layer 23 from contacting with the upper potential conductive material remained to cause short circuit.

In present embodiment, all the second insulating layers 16 above the first connection layer 23 is retained. However, the present disclosure is not limited to this. In other implementations, a part of the second insulating layer 16 above the first connection layer 23 close to the bending area may be etched away to expose a part of the first connection layer 23 for subsequent electrical connection with the first lead layer in the bending area.

Figure 8:
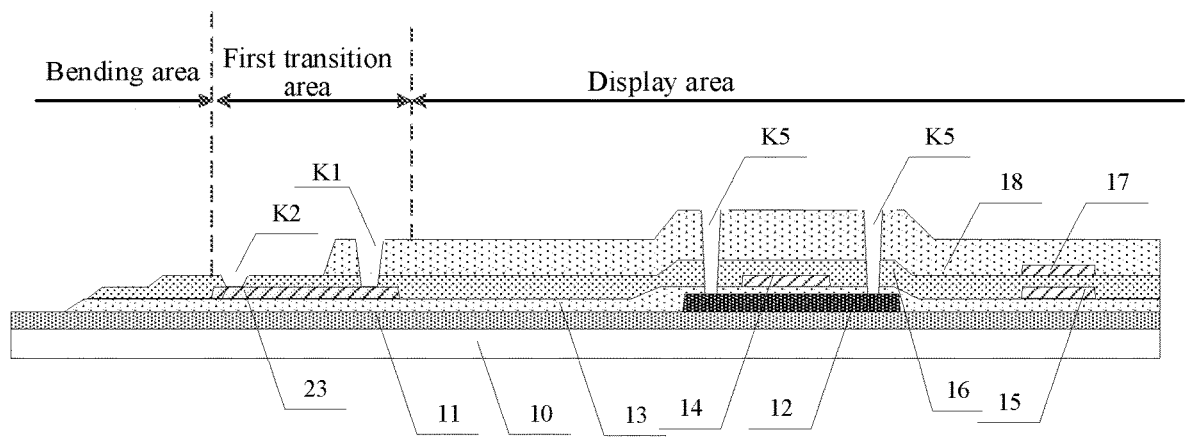
FIG. 8 is a schematic diagram of a display substrate after forming a first via hole, a second via hole, and a fifth via hole according to at least one embodiment of the present disclosure.

(7) a first via hole, a second via hole and a fifth via hole are formed. Forming the first via hole, the second via hole and the fifth via hole includes: perforating the first insulating layer 13, the second insulating layer 16, and the third insulating layer 18 on the substrate 10 formed with the above structure. The first via hole K1 and the fifth via hole K5 are opened on the third insulating layer 18, and the second via hole K2 is opened on the second insulating layer 16, as shown in FIG. 8. Among them, the first via hole K1, the second via hole K2, and the fifth via hole K5 may be carbon nanotube (CNT) holes. However, the present disclosure is not limited to this.

Among them, the first via hole K1 is located at the first step T1, and the third insulating layer 18 and the second insulating layer 16 in the first via hole K1 are etched away, to expose the first connection layer 23. The second insulating layer 16 in the second via hole K2 is etched away, to expose the first connection layer 23. Two fifth via holes K5 are located in the display area, and the third insulating layer 18, the second insulating layer 16 and the first insulating layer 13 in these two fifth via holes K5 are etched away, to expose two ends of the active layer 12.

Figure 9:
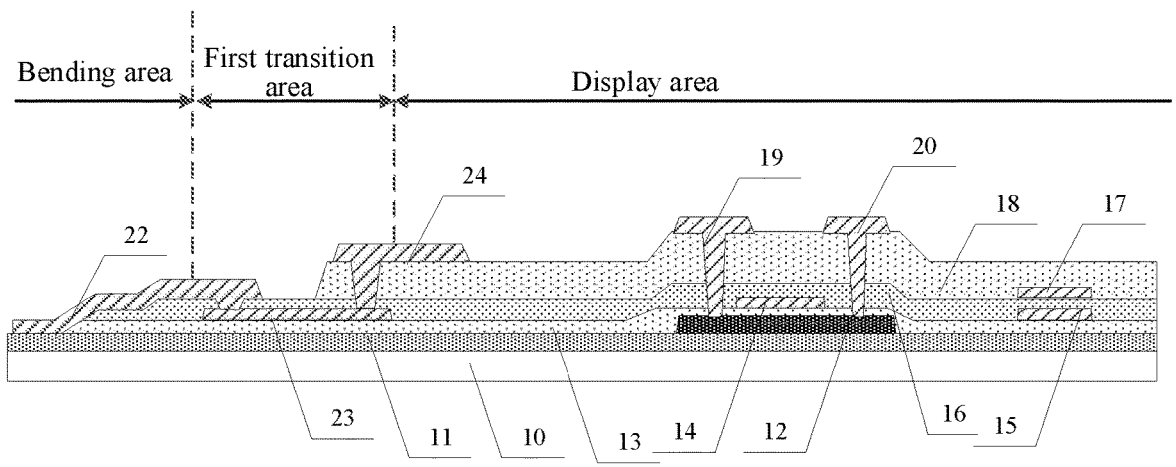
FIG. 9 is a schematic diagram of a display substrate after forming patterns of a signal lead layer, a first lead layer, and a source/drain electrode layer according to at least one embodiment of the present disclosure.

(8) Patterns of a source/drain electrode layer, a signal line layer and a first lead layer are formed. Forming Patterns of the source/drain electrode layer, the signal line layer and the first lead layer includes: depositing a third metal film on the substrate 10 with the above structure, patterning the third metal film by a patterning process, and forming patterns of a source electrode 19, a drain electrode 20, the signal line layer 24 (including data lines, for example) and the first lead layer 22 in the display area, as shown in FIG. 9. Among them, the source electrode 19 is connected with the active layer 12 through the fifth via hole K5, the drain electrode 20 is connected with the active layer 12 through the fifth via hole K5, the signal line layer 24 is electrically connected with the first connection layer 23 through the first via hole K1, and the first lead layer 22 is electrically connected with the first connection layer 23 through the second via hole K2.

Figure 10:
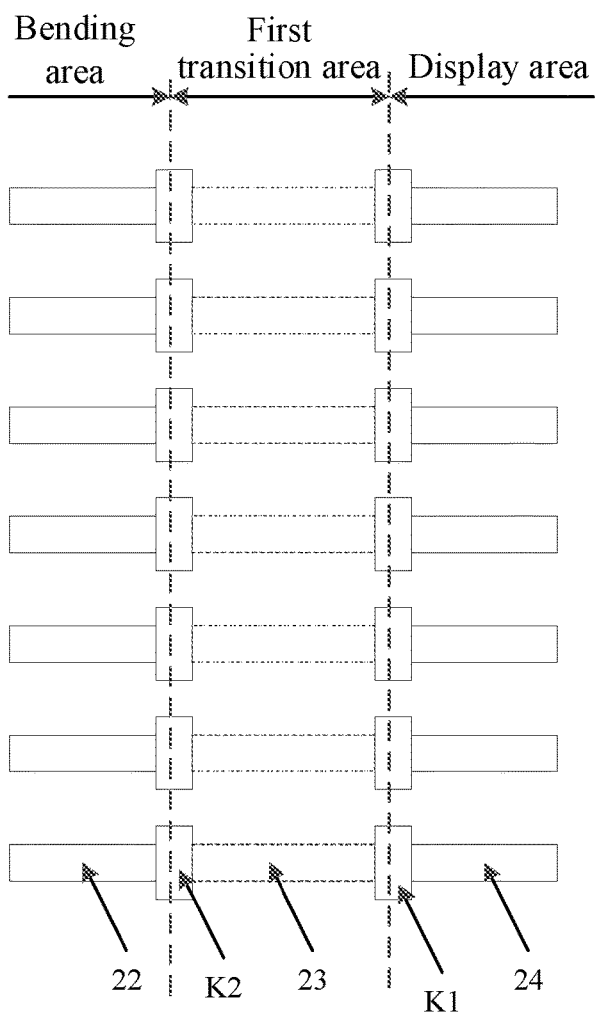
FIG. 10 is a schematic partial top view of a display area, a first transition area, and a bending area according to at least one embodiment of the present disclosure.

As shown in FIG. 10, the first connection layer 23 may electrically connect the signal line layer 24 in the display area and the first lead layer 22 in the bending area, thereby achieving the normal transmission of data signals. In present embodiment, a material of the first connection layer may be molybdenum (Mo), and joints between the first connection layer and the signal line layer and between the first connection layer and the first lead layer are ohmic contact, so that no obvious joint abnormality occurs, and normal signal transmission may be achieved.

Through the above processes, the manufacturing of the driving structure layer located in the display area, the first transition area and the lead connection structure of the bending area is completed on the substrate 10.

A subsequent manufacturing process includes forming of structures such as planarization (PLN) layer pattern, anode pattern, Pixel Define Layer (PDL) pattern, organic light emitting layers, cathode pattern, encapsulation layer, which are not described in detail here.

It can be seen from the above manufacturing process that according to the display substrate disposed in present embodiment, the first connection layer is disposed in the first transition area between the display area and the bending area, and the signal line layer in the display area and the first lead layer in the bending area are electrically connected, so that normal signal transmission may be achieved. Furthermore, there is no need to form a trace pattern at the first step of the first transition area, which may greatly reduce the conductive material remain at the step, thereby alleviating the problem of the conductive material remain at steps of the inorganic film layer in the bending area and effectively improving the etching speed in the signal wiring manufacturing process. In addition, the second insulating layer above the first connection layer is retained, which may reduce the problem of X-Line defect caused by the upper conductive material remain and short circuit of the first connection layer.

In addition, the manufacturing process according to the present disclosure may be achieved by using the existing mature manufacturing equipment, has little improvement on the existing process, may be well compatible with the existing manufacturing process, and has advantages of simple process realization, easy implementation, high production efficiency, low production cost and high yield rate, thus has good application prospect.

The structure shown in present embodiment and the manufacturing process thereof are merely illustrative. In some exemplary embodiment, the corresponding structure may be changed according to actual needs and the patterning processes may be added or reduced. For example, an organic light emitting diode (OLED) display substrate may be not only a top emission structure, but alternatively a bottom emission structure. For another example, the thin film transistor may be not only a top gate structure, but alternatively a bottom gate structure, or may be not only a dual gate structure, but alternatively a single gate structure. For another example, the thin film transistor may be an Amorphous Silicon (a-Si) thin film transistor, a low-temperature polysilicon (LTPS) thin film transistor or an oxide thin film transistor, and the driving structure layer and the light emitting structure layer may be disposed with other electrodes, leads and structure film layers. However, the embodiment of the present disclosure is not limited to this.

Figure 11:
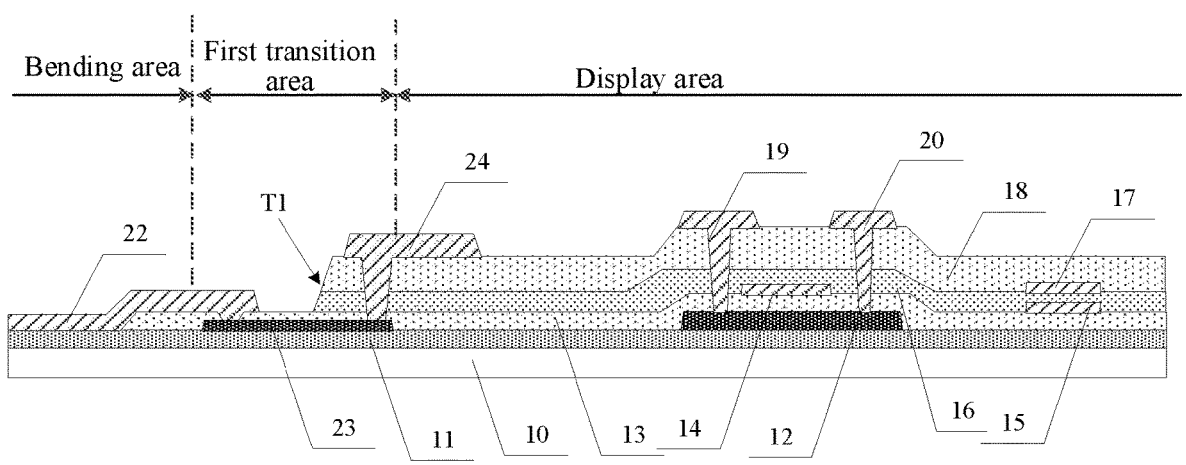
FIG. 11 is schematic diagram of another structure of a display substrate according to at least one embodiment of the present disclosure.

FIG. 11 is schematic diagram of another structure of a display substrate according to at least one embodiment of the present disclosure. FIG. 11 illustrates a structure of a display area, a first transition area and a bending area on a direction perpendicular to the display substrate. A first connection layer 23 of the display substrate of present embodiment is disposed on a barrier layer 11, that is, in the same layer as an active layer 12 of the display area. For other structure of the display substrate of the present embodiment, reference may be made to the description of the above embodiment, so it will not be repeated here.

In the present embodiment, the first connection layer 23 may be made of at least one material such as amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, etc.

In the following, a material of the first connection layer 23 is polysilicon (p-Si) as an example for description. The manufacturing process of the display substrate in the present embodiment is basically the same as that of the above embodiment, except that: In operation (2), the first connection layer 23 is also formed while a pattern of the active layer is formed on a substrate. For example, the first connection layer 23 may be completed by Excimer Laser Annealing (ELA) process and heavily doped by P+ Doping to ensure that the manufactured first connection layer 23 has good conductivity. In operation (3), only a pattern of a gate electrode layer is formed. In operation (6), a first step T1 is formed by etching parts of a second insulating layer 16 and a third insulating layer 18 above the first connection layer, that is, a first insulating layer 13 is retained on the first connection layer 23 to ensure that a surface of the first connection layer 23 is covered with an insulating layer, thereby preventing the first connection layer 23 from contacting with potential conductive material remained to cause short circuit.

Present embodiment also achieves the technical effects of the above embodiment, including alleviating the problem of conductive material remain at steps of the inorganic film in the bending area and improving the display effect of the display substrate.

Figure 12:
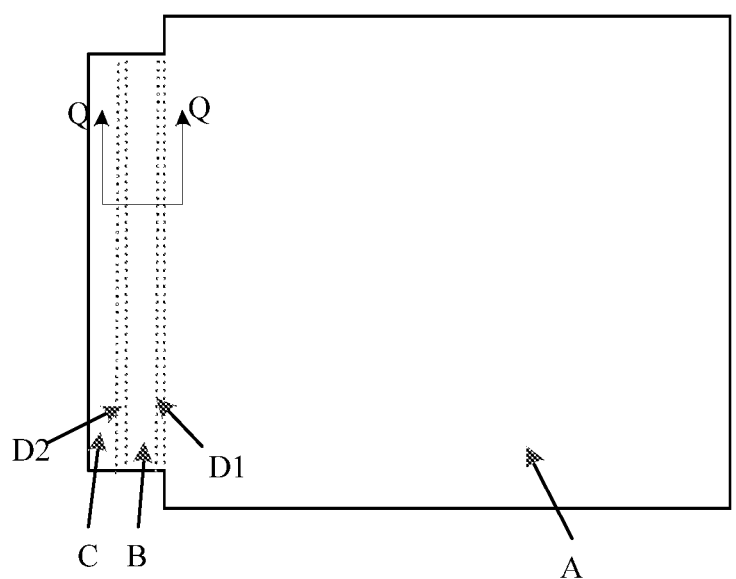
FIG. 12 is a schematic diagram of a still structure of a display substrate according to at least one embodiment of the present disclosure.
Figure 13:
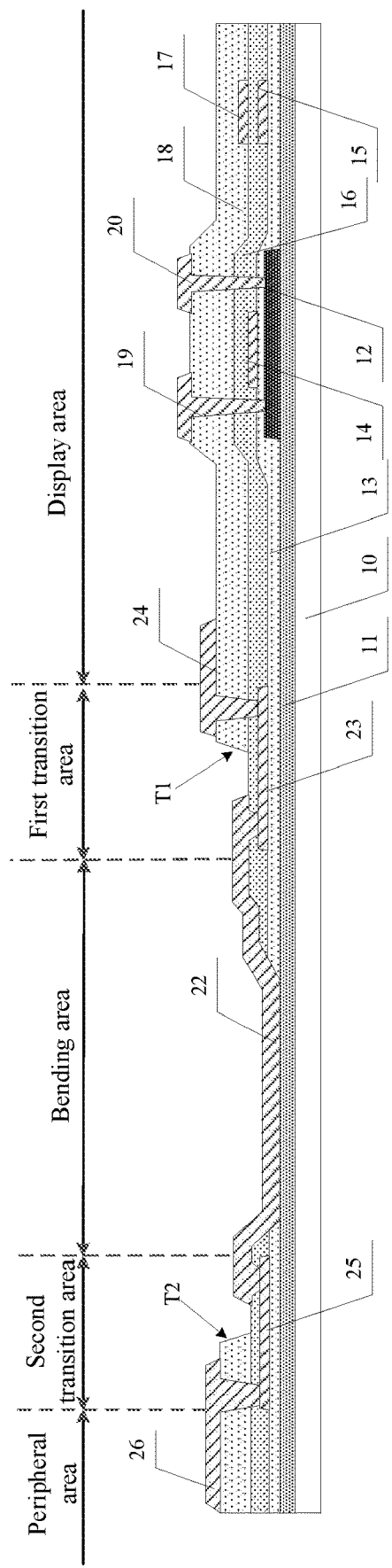
FIG. 13 is a partial sectional view taken along a Q-Q direction in FIG. 12.

FIG. 12 is a schematic diagram of a still structure of a display substrate according to at least one embodiment of the present disclosure. FIG. 13 is a partial sectional view taken along a Q-Q direction in FIG. 12. As shown in FIG. 12, on a direction parallel to the display substrate, a body structure of the display substrate includes a display area A, a first transition area D1, a bending area B, a second transition area D2 and a peripheral area C. The first transition area D1 is located between the display area A and the bending area B, and the second transition area D2 is located between the peripheral area C and the bending area B.

In present embodiment, in order to fold the peripheral area to the back of the display area, a second connection layer may be disposed in the second transition area between the bending area and the peripheral area, and electrically connect a first lead layer and a second lead layer, thereby achieving normal signal transmission.

FIG. 13 illustrates a structure of a display area, a first transition area, a bending area, a second transition area and a peripheral area on a direction perpendicular to a display substrate. On the direction perpendicular to the display substrate, the second transition area is disposed with a second connection layer, which electrically connects a second lead layer and a first lead layer respectively. For other structure of the display substrate of the present embodiment, reference may be made to the description of the embodiment shown in FIG. 3, so it will not be repeated here.

As shown in FIG. 13, on the direction perpendicular to the display substrate, a body structure of the bending area includes: a barrier layer 11 disposed on a substrate 10, a first lead layer 22 disposed on the barrier layer 11. A body structure of the first transition area includes: the barrier layer 11 disposed on the substrate 10, a first insulating layer 13 disposed on the barrier layer 11, a first connection layer 23 disposed on the first insulating layer 13, a second insulating layer 16 disposed on the first connection layer 23, and a first step T1 disposed on the second insulating layer 16. The first step T1 is formed of a third insulating layer 18. A body structure of the second transition area includes: the barrier layer 11 disposed on the substrate 10, the first insulating layer 13 disposed on the barrier layer 11, a second connection layer 25 disposed on the first insulating layer 13, the second insulating layer 16 disposed on the second connection layer 25, and a second step T2 disposed on the second insulating layer 16. The second step T2 is formed of the third insulating layer 18. A body structure of the peripheral area includes: the barrier layer 11, the first insulating layer 13, the second insulating layer 16, the third insulating layer 18, and the second lead layer 26 sequentially disposed on the substrate 10.

As shown in FIG. 13, a signal line layer 24 in the display area is electrically connected with the first connection layer 23 through a first via hole opened in the first step T1. The second lead layer 26 in the peripheral area is electrically connected with the second connection layer 25 through a third via hole opened in the second step T2. The first lead layer 22 in the bending area is electrically connected with the first connection layer 23 through a second via hole penetrating the second insulation layer 16 and electrically connected with the second connection layer 25 through a fourth via hole penetrating the second insulation layer 16.

The manufacturing process of the display substrate in the present embodiment is basically the same as that of the embodiment as shown in FIG. 3, except that: In operation (3), patterns of the first connection layer, the second connection layer and the gate electrode layer are formed. In other words, in the present embodiment, both the first connection layer 23 and the second connection layer 25 are disposed in the same layer and made of the same material as the gate electrode layer of the display area. In operation (6), the first step T1 is formed by etching a part of the third insulating layer 18 above the first connection layer 23, the second step T2 is formed by etching a part of the third insulating layer 18 above the second connection layer 25, and the first insulating layer 13, the second insulating layer 16 and the third insulating layer 18 in the bending area are etched away. In operation (7), the first via hole is opened in the first step T1 to expose the first connection layer 23, and the second via hole is opened in the second insulating layer 16 to expose the first connection layer 23. The third via hole is opened in the second step T2 to expose the second connection layer 25, and the fourth via hole is opened in the second insulation layer 16 to expose the second connection layer 25. In operation (8), the source/drain electrode layer, the signal line layer 24, the first lead layer 22 and the second lead layer 26 are simultaneously manufactured. The signal line layer 24 is electrically connected with the first connection layer 23 through the first via, the first lead layer 22 is electrically connected with the first connection layer 23 through the second via hole, the first lead layer 22 is electrically connected with the second connection layer 25 through the fourth via, and the second lead layer 26 is electrically connected with the second connection layer 25 through the third via hole.

In other implementations, both the first connection layer and the second connection layer may be disposed on the same layer as the active layer of the display area. Or, the first connection layer may be disposed on the same layer as the active layer in the display area, and the second connection layer may be disposed on the same layer as the gate electrode layer in the display area. Or, the first connection layer may be disposed on the same layer as the gate electrode layer in the display area, and the second connection layer may be disposed on the same layer as the active layer in the display area. The first connection layer and the second connection layer may be made of the same material or different materials. However, the embodiment of the present disclosure is not limited to this.

In the present embodiment, the signal line layer in the display area and the first lead layer in the bending area are electrically connected through the first connection layer, and the first lead layer in the bending area and the second lead layer in the peripheral area are electrically connected through the second connection layer, which can avoid wiring on the first step and the second step, thereby alleviating the problem of conductive material remain at the steps in the etching process, achieving normal signal transmission, improving product yield and ensuring display effect.

An embodiment of the present disclosure provides a manufacturing method of a display substrate to manufacture the display substrate of the above embodiments. The display substrate comprises a display area, a bending area and a first transition area between the display area and the bending area. The manufacturing method of a display substrate according to the present embodiment includes: forming a first connection layer in the first transition area and forming a first step on the first connection layer, wherein the first step is formed of at least one inorganic insulating layer; forming a signal line layer in the display area, and forming a first lead layer in the bending area. The signal line layer is electrically connected with the first connection layer through a first via hole opened in the first step, and the first lead layer is electrically connected with the first connection layer.

In an exemplary implementation, the manufacturing method of the present embodiment may further include: forming an inorganic insulating layer on the first connection layer before forming the first lead layer in the bending area, the inorganic insulating layer having a second via hole, so that the first lead layer formed subsequently is electrically connected with the first connection layer through the second via hole.

In an exemplary implementation, a material of the first connection layer may be metal or a material with semiconductor property.

In an exemplary implementation, forming the first connection layer in the first transition area may include: forming the first connection layer in the first transition area while a driving structure layer is formed in the display area, wherein the driving structure layer includes an active layer, a first insulating layer, a gate electrode layer, a second insulating layer, a capacitor electrode layer, a third insulating layer and a source/drain electrode layer sequentially disposed on a substrate; and the first connection layer and the active layer are disposed in the same layer, or the first connection layer and the gate electrode layer are disposed in the same layer.

In an exemplary implementation, the display substrate may further include: a peripheral area and a second transition area between the bending area and the peripheral area. The manufacturing method of the present embodiment may further include: forming a second connection layer in the second transition area and forming a second step on the second connection layer, wherein the second step is formed of at least one inorganic insulating layer; forming a second lead layer in the peripheral area while the signal line layer is formed in the display area, and a first lead layer is formed in the bending area. The second lead layer is electrically connected with the second connection layer through a third via hole opened in the second step, and the first lead layer is electrically connected with the second connection layer.

In an exemplary implementation, the manufacturing method of the present embodiment may further include: before forming the first lead layer in the bending area, forming an inorganic insulating layer on the second connection layer, the inorganic insulating layer has a fourth via hole, so that the first lead layer formed subsequently is electrically connected with the second connection layer through the fourth via hole.

In an exemplary implementation, the second connection layer and the first connection layer are disposed on the same layer and made of the same material.

The process for manufacturing the display substrate has been described in detail in the above embodiments and will not be repeated here.

Figure 14:
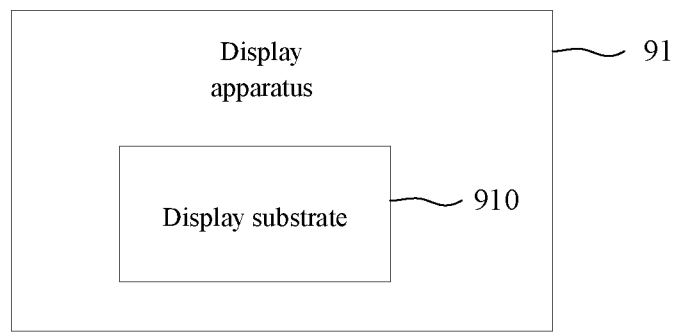
FIG. 14 is a schematic diagram of a display apparatus according to at least one embodiment of the present disclosure.

An embodiment of the present disclosure further provides a display apparatus which includes display substrates of above embodiments. FIG. 14 is a schematic diagram of a display apparatus according to at least one embodiment of the present disclosure. As shown in FIG. 14, the present embodiment provides a display apparatus 91, which includes a display substrate 910. The display substrate 910 is the display substrate according to the above embodiments. In some examples, the display apparatus 91 may be any product or component with a display function such as an OLED display panel, a mobile phone, a tablet computer, a television, a display, a notebook computer, a digital photo frame, a navigator, etc. However, the present disclosure is not limited to this.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the mentioned device or element must have a specific orientation, or be constructed and operated in a particular orientation, and therefore they should not be construed as limitation to the present disclosure.

In the description of the embodiments of the present disclosure, unless otherwise clearly specified and defined, the terms "install", "couple", "connect" should be broadly interpreted, for example, it may be a fixed connection, or a detachable connection, or an integrated connection; it may be a mechanical connection or an electrical connection; it may be a direct connection, or may be an indirect connection through an intermediary, or may be an internal connection between two elements. Those of ordinary skills in the art can understand the specific meanings of the above terms in the present disclosure according to situations.

Although the embodiments disclosed in the present disclosure are as described above, the described contents are only the embodiments for facilitating understanding of the present disclosure, which are not intended to limit the present disclosure. Any person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What we claim is:

1. A display substrate, comprising:
a display area, a bending area, and a first transition area between the display area and the bending area;
wherein the display area is disposed with a signal line layer, the bending area is disposed with a first lead layer, the first transition area is disposed with a first connection layer, and the first connection layer is disposed with a first step formed of at least one inorganic insulating layer; and
the signal line layer is electrically connected with the first connection layer through a first via hole opened in the first step, and the first lead layer is electrically connected with the first connection layer,
wherein the display substrate further comprises a second transition area and a peripheral area, and the second transition area is located between the bending area and the peripheral area;
the peripheral area is disposed with a second lead layer, the second transition area is disposed with a second connection layer, and the second connection layer is disposed with a second step formed of at least one inorganic insulating layer;
the second lead layer is electrically connected with the second connection layer through a third via hole opened in the second step, and the first lead layer is electrically connected with the second connection layer.

2. The display substrate according to claim 1, wherein a material of the first connection layer is metal or a material with semiconductor property.

3. The display substrate according to claim 1, wherein the display area is further disposed with a driving structure layer; the driving structure layer comprises an active layer, a first insulating layer, a gate electrode layer, a second insulating layer, a capacitor electrode layer, a third insulating layer and a source/drain electrode layer which are sequentially disposed on a substrate; and the signal line layer, the first lead layer and the source/drain electrode layer are disposed in a same layer, wherein the first connection layer and the gate electrode layer are disposed in a same layer, or the first connection layer and the active layer are disposed in a same layer.

4. The display substrate according to claim 1, wherein an inorganic insulating layer is disposed between the first lead layer and the second connection layer, and the first lead layer is electrically connected with the second connection layer through a fourth via hole penetrating through the inorganic insulating layer.

5. The display substrate according to claim 1, wherein the second connection layer and the first connection layer are disposed in a same layer and made of the a material.

6. A display apparatus, comprising the display substrate according to claim 1.

7. The display substrate according to claim 1, wherein an inorganic insulating layer is disposed between the first lead layer and the first connection layer, and the first lead layer is electrically connected with the first connection layer through a second via hole penetrating through the inorganic insulating layer.

8. A manufacturing method for a display substrate, the display substrate comprising a display area, a bending area, and a first transition area between the display area and the bending area, the manufacturing method comprising:
   forming a first connection layer in the first transition area, and forming a first step on the first connection layer, the first step being formed of at least one inorganic insulating layer;
   forming a signal line layer in the display area, and forming a first lead layer in the bending area, wherein the signal line layer is electrically connected with the first connection layer through a first via hole opened in the first step, and the first lead layer is electrically connected with the first connection layer,
   wherein the display substrate further comprises a peripheral area, a second transition area located between the bending area and the peripheral area;
   the manufacturing method further comprises:
   forming a second connection layer in the second transition area, and forming a second step on the second connection layer, the second step being formed of at least one inorganic insulating layer; and
   forming a second lead layer in the peripheral area while the signal line layer is formed in the display area and the first lead layer is formed in the bending area, wherein the second lead layer is electrically connected with the second connection layer through a third via hole opened in the second step, and the first lead layer is electrically connected with the second connection layer.

9. The manufacturing method according to claim 8, wherein a material of the connection layer is metal or a material with semiconductor property.

10. The manufacturing method according to claim 8, wherein forming the first connection layer in the first transition area comprises:
    forming the first connection layer in the first transition area while a driving structure layer is formed in the display area, wherein the driving structure layer comprises an active layer, a first insulating layer, a gate electrode layer, a second insulating layer, a capacitor electrode layer, a third insulating layer and a source/drain electrode layer which are sequentially disposed on a substrate;
    wherein the first connection layer and the active layer are disposed in a same layer, or the first connection layer and the gate electrode layer are disposed in a same layer.

11. The manufacturing method according to claim 8, further comprising: before forming the first lead layer in the peripheral area, forming an inorganic insulating layer on the second connection layer, wherein the inorganic insulating layer has a fourth via hole, to make the first lead layer to be electrically connected with the second connection layer through the fourth via hole.

12. The manufacturing method according to claim 8, wherein the second connection layer and the first connection layer are disposed in a same layer and made of a same material.

13. The manufacturing method according to claim 8, further comprising: before forming the first lead layer in the bending area, forming an inorganic insulating layer on the first connection layer, wherein the inorganic insulating layer has a second via hole, to make the first lead layer to be electrically connected with the first connection layer through the second via hole.

* * * * *